United States Patent
Barwicz et al.

(10) Patent No.: US 8,347,729 B2
(45) Date of Patent: Jan. 8, 2013

(54) PIEZORESISTIVE STRAIN SENSOR BASED NANOWIRE MECHANICAL OSCILLATOR

(75) Inventors: Tymon Barwicz, Yorktown Heights, NY (US); Hendrik F. Hamann, Yorktown Heights, NY (US); Levente Klein, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 478 days.

(21) Appl. No.: 12/616,965

(22) Filed: Nov. 12, 2009

(65) Prior Publication Data

US 2011/0107841 A1    May 12, 2011

(51) Int. Cl.
    *G01L 1/00*   (2006.01)
(52) U.S. Cl. ......................................................... 73/778
(58) Field of Classification Search ............... 73/778, 73/777, 760
    See application file for complete search history.

(56) References Cited

U.S. PATENT DOCUMENTS

| | | | |
|---|---|---|---|
| 7,075,160 B2 | 7/2006 | Partridge et al. | |
| 7,123,111 B2 * | 10/2006 | Brunson et al. | 331/116 M |
| 7,302,856 B2 * | 12/2007 | Tang et al. | 73/777 |
| 7,330,795 B2 | 2/2008 | Roukes et al. | |
| 7,552,645 B2 * | 6/2009 | Bargatin et al. | 73/777 |
| 7,598,723 B2 * | 10/2009 | Gaillard et al. | 324/76.42 |
| 7,617,736 B2 * | 11/2009 | Tang et al. | 73/777 |
| 8,039,834 B2 * | 10/2011 | Wang et al. | 257/43 |
| 2005/0161749 A1 | 7/2005 | Yang et al. | |
| 2009/0054267 A1 | 2/2009 | Roukes et al. | |

OTHER PUBLICATIONS

Imran Mahboob et al., "Electron Phase Modulation in a High Q Nanomechanical Resonator", Indium Phosphide & Related Materials, 2007, IPRM '07, IEEE19th International Conference on May 14-18, 2007, pp. 396-398.
Rongrui He et al., "Self-Transducing Silicon Nanowire Electromechanical Systems at Room Temperature", Nano Letters, Jun. 2008, vol. 8, No. 6, pp. 1756-1761.
I. Bargatin et al., "Sensitive Detection of Nanomechanical Motion Using Piezoresistive Signal Downmixing", Applied Physics Letters, Mar. 28, 2005, vol. 86, No. 13, pp. 133109-1-133109-3.

* cited by examiner

*Primary Examiner* — Lisa M. Caputo
*Assistant Examiner* — Octavia Davis-Hollington
(74) *Attorney, Agent, or Firm* — Cantor Colburn LLP; Vazken Alexanian

(57) ABSTRACT

An apparatus is provided and includes compressed conductive elements that each have independently adjustable dimensions sufficient to provide substantially enhanced piezoresistance to a current flowing across each conductive element with each of the conductive elements subjected to compressive strain, the conductive elements being oscillated in a direction parallel to that of the compressive strain at a defined frequency such that a resistance of the conductive elements to the current is thereby substantially reduced.

20 Claims, 6 Drawing Sheets

PIEZORESISTIVE STRAIN SENSOR BASED NANOWIRE MECHANICAL OSCILLATOR

BACKGROUND

Aspects of the present invention are directed to a piezoresistive strain sensor.

A resonator is a device or system that exhibits resonance or resonant behavior and naturally oscillates at its resonance frequencies with an amplitude that exceeds the amplitude of oscillation at other non-resonant frequencies. The oscillations in a resonator can be either electromagnetic or mechanical and allow resonators to be used to either generate waves of specific frequencies or to select specific frequencies to be filtered or unfiltered from a signal. For example, in wireless communications, if an input signal matches a predefined frequency of a resonator the resonator can be made to filter a second signal accordingly.

A problem exists, however, in that such resonators have high impedance to the second signal and may lack sensitivity to the input signal. In these cases, the resonator may not be able to adequately filter the second signal and may be unable to determine whether a match between the input signal and the predefined frequency occurs. As a result, an operational effectiveness of the resonator may be impaired or at least substantially reduced.

SUMMARY

In accordance with an aspect of the invention, an apparatus is provided and includes compressed conductive elements that each have independently adjustable dimensions sufficient to provide substantially enhanced piezoresistance to a current flowing across each conductive element with each of the conductive elements subjected to compressive strain, the conductive elements being oscillated in a direction parallel to that of the compressive strain at a defined frequency such that a resistance of the conductive elements to the current is thereby substantially reduced.

In accordance with another aspect of the invention, an apparatus is provided and includes a displaceable part disposed proximate to non-displaceable parts and conductive elements to connect the displaceable and non-displaceable parts in series and having independently adjustable dimensions sufficient to provide the conductive elements with substantially enhanced piezoresistance during compressive loading of the conductive elements caused by displacement of the displaceable part relative to the non-displaceable parts, and to define the conductive elements as having a resonance frequency in accordance with the dimensions.

In accordance with another aspect of the invention, an apparatus is provided and includes an input and an output electrode, a displaceable block disposed proximate to the input and output electrodes, first and second electrodes to displace the displaceable block relative to the input and output electrodes and to cause the displaceable block to oscillate in a direction parallel with that of the displacement, respectively and sets of conductive elements to electrically connect the displaceable block to the input and output electrodes in series and having independently adjustable dimensions sufficient to provide the conductive elements with substantially enhanced piezoresistance during compressive loading caused by the displacement, and to define the conductive elements as having a resonance frequency in accordance with the dimensions, the displaceable block being oscillated at least at the resonance frequency.

BRIEF DESCRIPTIONS OF THE SEVERAL VIEWS OF THE DRAWINGS

The subject matter regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

DETAILED DESCRIPTION

The oscillating frequency of resonators with dimensions below 1 μm are in the GHZ frequency range, which is a domain widely used in wireless telecommunication. Frequencies in the GHz range can be achieved with large mass resonators where higher modes or complex oscillation frequencies can be utilized to operate the mechanical resonators. Nevertheless the higher modes would allow a smaller linear response regime. As the resonance frequency of the oscillator increases, the quality factor (sharpness of the resonances) decreases due to thermo-elastic dissipation following an empirical rule of fQ=const, where f is the resonance frequency and Q is the quality factor of oscillator. Thermoelastic dissipation in mechanical resonators are the fundamental limiting factors for highest achievable Q at a given resonance frequency f. In accordance with aspects of the present invention, for a longitudinal oscillator, the thermo-elastic dissipation is highly reduced compared to the flexural oscillators.

Figure 1:
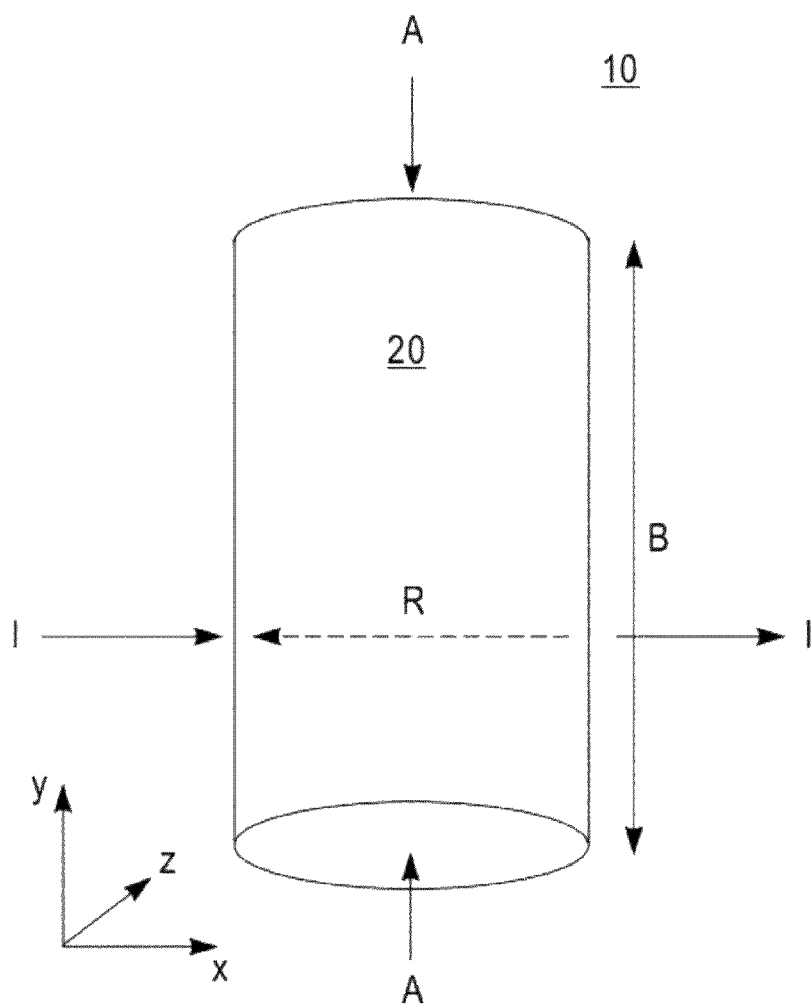
FIG. 1 is a schematic view of an apparatus with compressed conductive elements.

With reference to FIG. 1, an apparatus 10 is provided and includes compressed conductive elements 20 of which only one is shown. The conductive elements 20 are compressed in a direction indicated by opposing arrows A and have dimensions x, y and z that are sufficiently small such that the conductive elements 20 provide at least substantially enhanced piezoresistive properties under compression. The conductive elements 20, each of which may be a nanowire, can have a circular or rectangular cross section.

The conductive elements 20 are oscillated in a direction indicated by arrow B that is defined as being substantially parallel to direction A, which is reflective of the direction of compressive strain. The oscillation is conducted at least at a defined frequency that is substantially equal to a resonance frequency of the conductive elements 20. Due to the piezoresistive properties of the conductive elements 20, when the conductive elements 20 are compressed and oscillated at the defined resonance frequency, a resistance R of the conductive elements 20 to a current I flowing through the conductive elements 20 is substantially reduced as compared to a normal resistance of the conductive elements 20 when the oscillation is not at the defined resonance frequency.

Since the conductive elements 20 may each have slightly varying dimensions, the resonance frequency of each is accordingly slightly varied. Thus, a series of resonance frequencies of the aggregated conductive elements 20 can be achieved by varying the dimensions of the individual conductive elements 20.

The apparatus 10 may be deployed in various applications including but not limited to small mass detection, low power electronic switches, highly sensitive strain sensors, accelerometers, GHz frequency mechanical oscillators for on chip signal generation and electro-mechanical filters with performance potential that is compatible with wireless communication systems.

In accordance with embodiments of the invention, the conductive elements 20 may include singular or arrays of silicon nanowires 40 (see FIG. 2) that have dimensions suitable for causing their resistance to change under compression and for causing them to be more sensitive to such changes under compression. Indeed, while they are compressed, the sensitivity of the silicon nanowires 40 is at least an order of magnitude larger with respect to an applied strain than that of bulk silicon. This sensitivity increases as the diameter of the nanowires is reduced.

Figure 2:
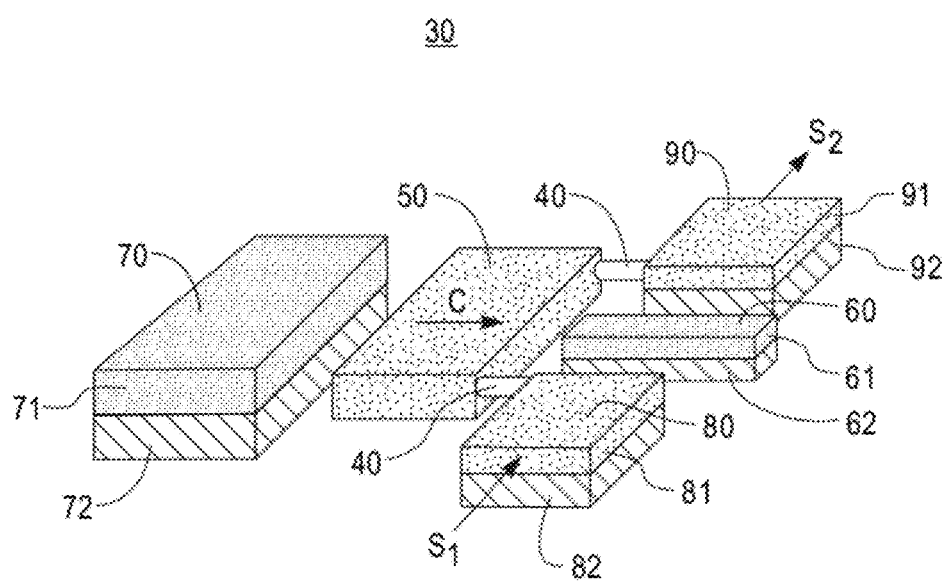
FIG. 2 is a perspective view of a resonator according to embodiments of the invention.

In particular, with reference to FIG. 2, a nanoscale mechanical resonator 30 is provided that converts a broadband input electrical signal $S_1$, such as a broadband radio-frequency (RF) signal, to a filtered output signal $S_2$, such as a combination of DC and AC currents, by employing mechanical or electro-mechanical oscillations of the resonator 30. The resonator 30 is generally U-shaped and has an increased transduction mechanism as independently adjustable dimensions of the nanowires 40 are decreased. This leads to relatively very sharp resonances due to small dissipation characteristics associated with correspondingly small displacements and oscillation direction of the nanowires 40. The detection scheme may be purely electrical and may enable complementary metal-oxide-semiconductor (CMOS) circuit integration signal detection and amplification and the sensitivity to strain of the resonator 30 may be an order of magnitude larger compared with all existing strain sensing mechanisms.

As shown in FIG. 2, silicon nanowires 40 may be integrated in a resonator 30 and can provide the resonator 30 with relatively small motion resistance and low phase noise in, e.g., wireless communications. The oscillating parts of the resonator 30 are the nanowires 40 that are each connected to a silicon block 50. The silicon block 50 is designed such that its resonance frequencies are well above the nanowire resonance frequencies. The actuation is implemented by a double gate approach where the inner electrode (or first electrode) 60 compressively strains the nanowires 40 while the second gate (or second electrode) 70 modulates the resonator 30 based on electrostatic force. In an alternative embodiment, the actuation can be implemented by using the inner electrode 60 for both the compression and the actuation.

The oscillation may be detected by measuring current flow through the resonator 30 with a change in resistance being proportional with the strain variation. In a compressive regime, the nanowire resistances decrease as the nanowires 40 are strained and, combined with oscillation at the resonance frequencies, gives about a 100× increase of piezoresistive gauge factor. A sensor incorporating the resonator 30 can, therefore, detect strain as small as 0.001% of current strain detectors.

Figure 3:
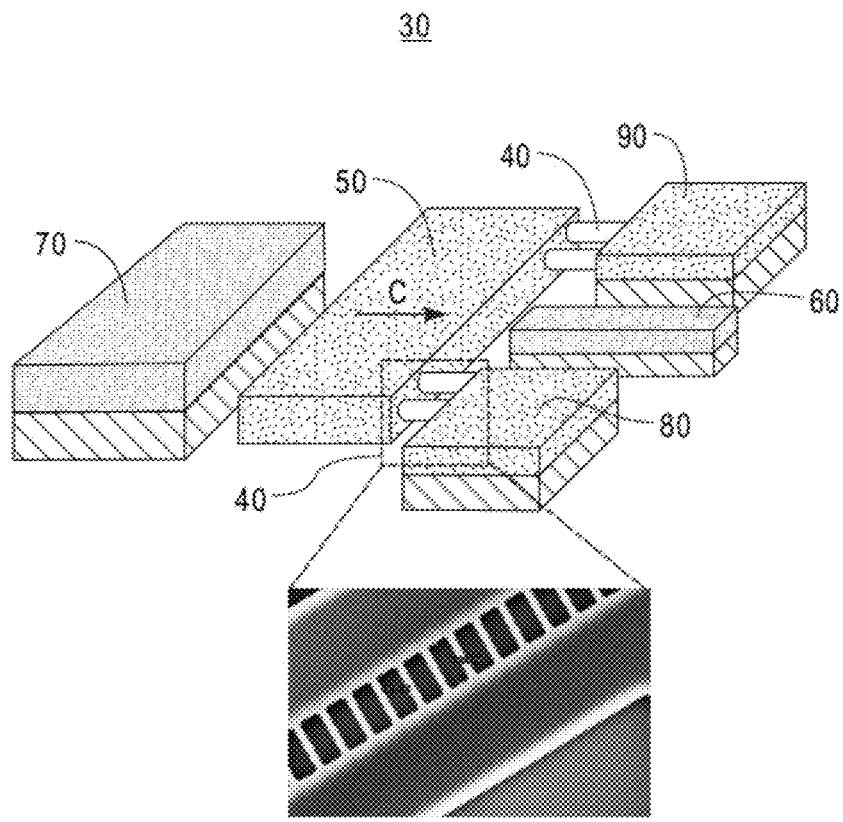
FIG. 3 is a perspective view of a resonator according to further embodiments of the invention.

As shown in FIG. 3, the current flowing through the resonator 30 may be increased by employing a large number of nanowires 40 in parallel. The larger number of nanowires 40 would decrease the phase noise and motion resistance of the resonator 30 and make its performance compatible with satellite communications requirements. The motion resistance of the nanowires 40 in an array can be reduced to about 50Ω, which is ideal for radio frequency (RF) communications.

Still referring to FIG. 2, the resonator 30 includes an input electrode 80 to which a direct current (DC) is applied as signal $S_1$ and an output electrode 90 from which a DC and an alternating current (AC) are outputted as signal $S_2$. The AC signal is on the resonance frequency of the mechanical oscillator. The silicon block 50 is displaceable and disposed proximate to the input and output electrodes 80 and 90. The first electrode 60 is disposed proximate to the silicon block 50 and is configured to electro-mechanically displace the silicon block 50 to thereby compress the nanowires 40. This displacement is shown in FIG. 2 as being parallel with the direction of the arrow C. The second electrode 70 is similarly disposed proximate to the silicon block 50 and is configured to electro-mechanically modulate the nanowires 40 by causing the silicon block 50 to oscillate in a direction parallel with the direction indicated by arrow C.

The nanowires 40 may be provided as sets of one or more nanowires 40 that electrically connect the silicon block 50 to the input electrode 80 and the output electrode 90 in series. As mentioned above, the nanowires 40 have dimensions that are sufficient to provide substantially enhanced piezoresistance during compression caused by the displacement of the silicon block 50. With the arrangement described above, DC current applied to the input electrode 80 flows through the nanowires 40 and the silicon block 50 to the output electrode 90 with the nanowires 40 and the silicon block 50 acting as resistive elements. When the second electrode 70 causes the silicon block 50 to oscillate at a resonance frequency of the nanowires 40, however, the piezoresistive properties of the nanowires 40 causes the resistance of the nanowires 40 to substantially decrease such that relatively easily detectable DC and AC current is output from the output electrode 90.

In accordance with embodiments of the invention, the silicon block 50 may be formed of silicon or some other suitable electrically conductive material. It is generally relatively long and should extend at least far enough to overlap lengthwise and height-wise with the input and output electrodes 80 and 90. In this way, the nanowires 40 will be connectable between the silicon block 50 and the input and output electrodes 80 and 90.

The first electrode 60 and the second electrode 70 form a system to electro-mechanically displace the silicon block 50 so as to compress and oscillate the nanowires 40. That is, the first electrode 60 displaces the silicon block 50 in the C direction to cause compressive loading of the nanowires 40 and may include a metallic layer 61 disposed on an oxide layer 62. The second electrode 70 causes the silicon block 50 to oscillate in the C direction at multiple frequencies including but not limited to a resonance frequency of the nanowires 40. The second electrode 70 may include a metallic layer 71 disposed on an oxide layer 72.

The input and output electrodes 80 and 90 are generally immobile and may include a silicon layer 81, 91 disposed on an oxide layer 82, 92. The input and output electrodes 80 and 90 may, therefore, be employed as electrical leads that are otherwise coupled to additional electrical components. In some cases, the resonator 30 may be provided as part of a set of resonators that are connected to one another in series or in parallel. In these cases, the input and output electrodes 80 and 90 may be coupled to complementary input and output electrodes of other adjacent resonators.

The nanowires 40 are generally conductive elements and may be formed of silicon or some other suitable material and may be provided as at least one of a pair of single nanowires 40 and sets of about 100-500 nanowires 40 as shown in FIG.

Figure 4:
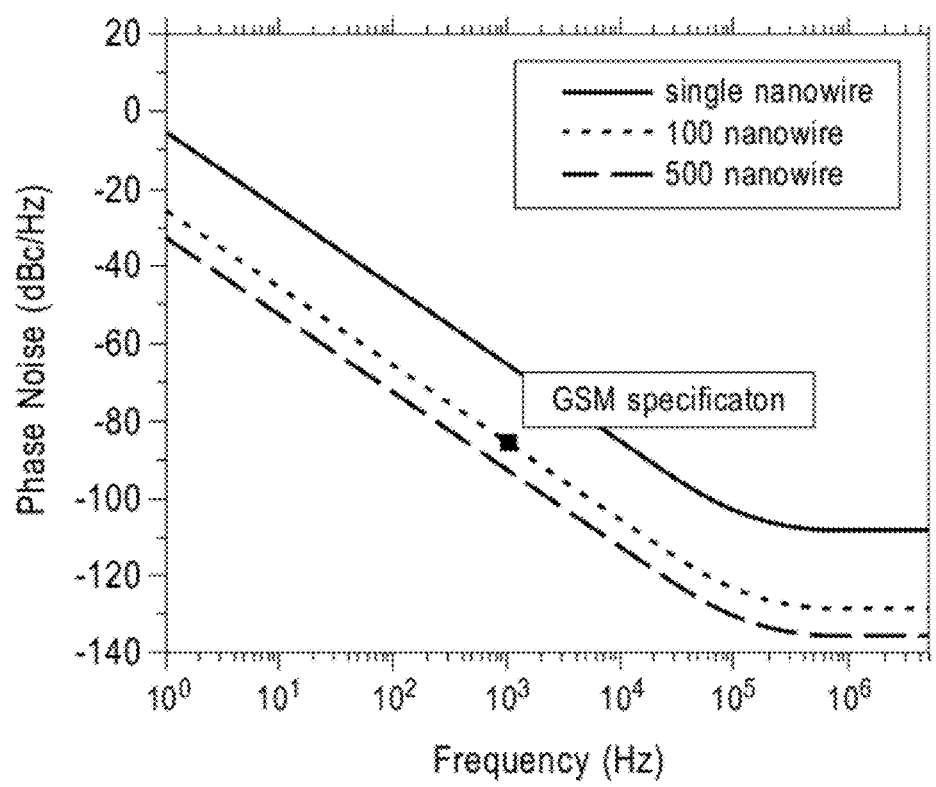
FIG. 4 is a graph illustrating performance characteristics of a resonator in accordance with embodiments of the present invention.

3. The set of about 100-500 nanowires can be arranged as 1-row arrays or as multi-row arrays in accordance with the available space provided on the silicon block 50 and the input and output electrodes 80 and 90. The sets of nanowires 40 further provide at least one of substantially decreased phase noise and motion resistance of about 50Ω as shown in FIG. 4 where a set of about 100 nanowires 40 allows the resonator 30 to meet industry guidelines (Global System for Mobile Communication (GSM) specifications) and a 500 nanowire 40 set exceeds those guidelines.

As a general matter, the resonance frequency of the resonator 30 described above is:

$$\omega_0 = \frac{1}{L}\sqrt{\frac{E}{\rho}}\xi \qquad \text{Equation 1}$$

where L is the length of the nanowire, E is the Young's modulus, ρ is Silicon density and ξ is a correction factor that takes into account the relative mass of the resonator compared with the connecting block. This correction factor can be determined numerically.

A change in resistance that occurs with the silicon nanowires oscillated at their resonance frequencies can be expressed as:

$$\frac{\Delta R}{R} = K\varepsilon \qquad \text{Equation 2}$$

where K is a piezoresistance guage factor and ε is the induced strain caused by the displacement of the silicon block 50. In some cases, the change in resistance can be up to about 40% of the total resistance value of the nanowires 40 with the change increasing as wire diameter decreases.

Figure 5:
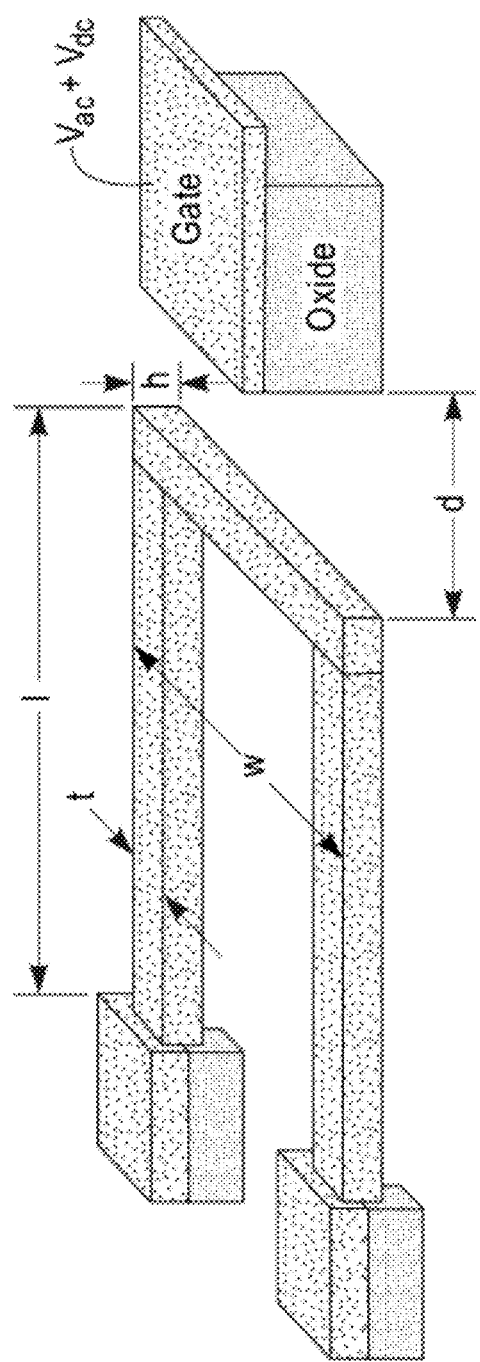
FIG. 5 is a perspective view of components of the resonators of FIGS. 2 and 3.

With reference to FIG. 5, it is noted that, with respect to the resonator 30 of FIG. 2 or 3, displacement of the resonator 30 due to electromechanical or electrostatic force ($F_{el}$) provided by the first and second electrodes 60 and 70 is given by the equation:

$$X_o(\omega) = \frac{F_{el}}{k_{eff}} \frac{1}{\sqrt{\left(1-\frac{\omega^2}{\omega_0^2}\right)^2 + \frac{\omega^2}{Q^2\omega_0^2}}}$$

$$= V_{ac}V_{dc}\frac{\varepsilon_0}{d^2}\frac{4l}{E\pi^2}\frac{w}{t}\frac{1}{\sqrt{\left(1-\frac{\omega^2}{\omega_0^2}\right)^2 + \frac{\omega^2}{Q^2\omega_0^2}}} \qquad \text{Equation 3}$$

where $k_{eff}$ is the effective spring constant, ω is the applied frequency, $\omega_O$ is the resonance frequency and $V_{ac}$ and $V_{dc}$ are the voltages applied to the electrodes, such that the change in resistance of the resonator is:

$$\frac{\Delta R}{R} = \frac{K}{l}\int_0^l \varepsilon\, dx = \frac{K}{l}X_0(\omega) \qquad \text{Equation 4}$$

and the change in resonance when the nanowires 40 are oscillated at their resonance frequencies is:

$$\frac{\Delta R}{R} = KV_{ac}V_{dc}\frac{4\varepsilon_0}{d^2E\pi^2}\frac{w}{t}Q. \qquad \text{Equation 5}$$

Thus, it may be seen that the change in resistance is independent of the thickness and length of the resonator 30 being determined by the width (t) and distance (w). In a case of relatively giant piezoresistance, the gauge factor is orders of magnitude larger than it otherwise would be for bulk silicon. This is especially true where the diameter of the nanowires 40 is less than 50 nm. At this level, it is seen that the K factor increases substantially.

Figure 6:
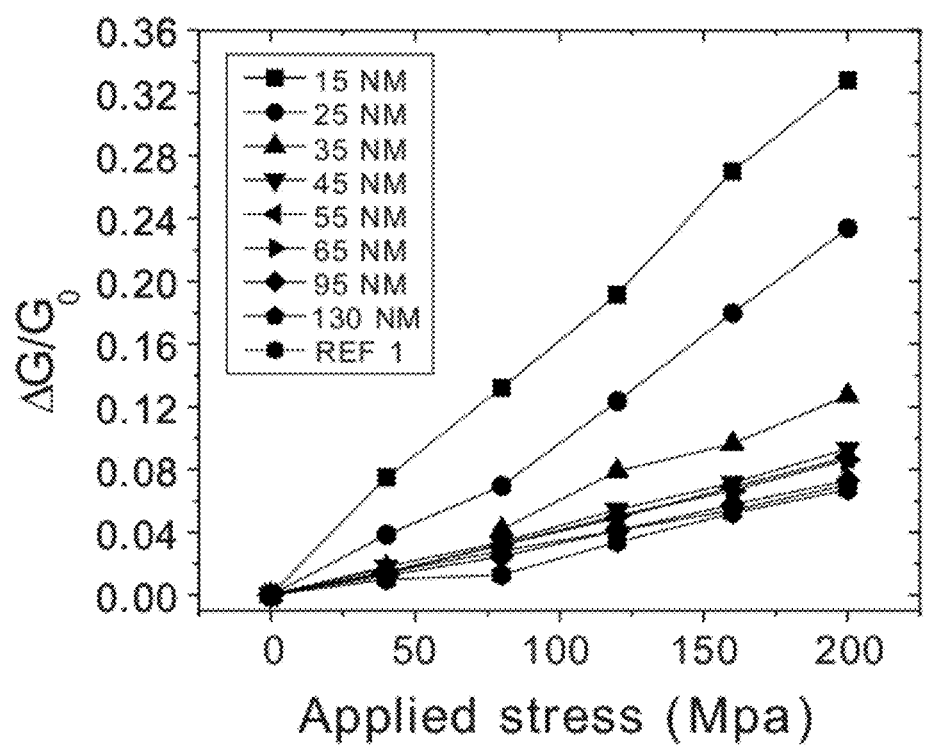
FIG. 6 is a graph illustrating increased piezoresistance as a function of wire dimensions.

This may be seen, in particular, with reference to FIG. 6, in which increasing piezoresistance is illustrated as being a function of wire dimensions. In FIG. 6, $\Delta G/G_0$ is a measure of change in resistivity (resistivity G=1/R where R is the resistance of the nanowire at a given stress and $G_0=1/R^0$ is the resistivity at zero applied stress) of the nanowires 40 and the applied stress refers to the stress placed thereon. As shown, the nanowires 40 exhibit significant increases in resistivity (i.e., piezoresistivity) at constant applies stress as the wire diameter decreases, as described and predicted above.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular exemplary embodiment disclosed as the best mode contemplated for carrying out this disclosure, but that the disclosure will include all embodiments falling within the scope of the appended claims.

What is claimed is:

1. An apparatus comprising compressed conductive elements that each have independently adjustable dimensions sufficient to provide substantially enhanced piezoresistance to a current flowing across each conductive element with each of the conductive elements subjected to compressive strain, the conductive elements being oscillated in a direction parallel to that of the compressive strain at a defined frequency such that a resistance of the conductive elements to the current is thereby substantially reduced.

2. The apparatus according to claim 1, wherein the conductive elements have dimensions sufficient to further provide at least one of substantially decreased phase noise and motion resistance of about 50 Ω.

3. An apparatus, comprising:
   a displaceable part disposed proximate to non-displaceable parts; and
   conductive elements to connect the displaceable and non-displaceable parts in series and having independently adjustable dimensions sufficient to provide the conductive elements with substantially enhanced piezoresistance during compressive loading of the conductive elements caused by displacement of the displaceable part relative to the non-displaceable parts, and to define the conductive elements as having a resonance frequency in accordance with the dimensions.

4. The apparatus according to claim 3, wherein the resonance frequency of the conductive elements is a function of a length of the conductive elements.

5. The apparatus according to claim 3, wherein the displaceable part comprises a conductive material.

6. The apparatus according to claim 3, wherein the displaceable part comprises silicon.

7. The apparatus according to claim 3, further comprising a system to electromechanically displace the displaceable part, the system comprising:
   a first electrode to displace the displaceable part in a direction to cause compressive loading of the conductive elements; and
   a second electrode to cause the displaceable part to oscillate in the direction.

8. The apparatus according to claim 7, wherein at least one of the first and second electrodes comprises a metallic layer disposed on an oxide layer.

9. The apparatus according to claim 7, wherein the displaceable part is caused to oscillate at the resonance frequency.

10. The apparatus according to claim 3, wherein the non-displaceable parts comprise a silicon layer disposed on an oxide layer.

11. The apparatus according to claim 3, wherein the conductive elements have varied lengths with respect to one another.

12. The apparatus according to claim 3, wherein the conductive elements each comprise a silicon nanowire.

13. The apparatus according to claim 3, wherein the conductive elements comprise at least one or more of a pair of single nanowires, sets of about 100 nanowires and sets of about 500 nanowires to connect the displaceable and the non-displaceable parts, respectively.

14. An apparatus, comprising:
   an input and an output electrode;
   a displaceable block disposed proximate to the input and output electrodes;
   first and second electrodes to displace the displaceable block relative to the input and output electrodes and to cause the displaceable block to oscillate in a direction parallel with that of the displacement, respectively; and
   sets of conductive elements to electrically connect the displaceable block to the input and output electrodes in series and having independently adjustable dimensions sufficient to provide the conductive elements with substantially enhanced piezoresistance during compressive loading caused by the displacement, and to define the conductive elements as having a resonance frequency in accordance with the dimensions, the displaceable block being oscillated at least at the resonance frequency.

15. The apparatus according to claim 14, wherein a direct voltage is applied to the input electrode and a corresponding direct current is outputted from the output electrode and the second electrode causes the displaceable block to oscillate at a resonance frequency of the conductive elements.

16. The apparatus according to claim 15, wherein an alternating current on the resonance frequency of the conductive elements is further output from the output electrode.

17. A strain sensor comprising the apparatus according to claim 16.

18. An accelerometer comprising the apparatus according to claim 16.

19. An oscillator comprising the apparatus according to claim 16.

20. A filter for use in wireless communication comprising the apparatus according to claim 16.

* * * * *